United States Patent

Walker et al.

[11] 4,061,979
[45] Dec. 6, 1977

[54] PHASE LOCKED LOOP WITH PRE-SET AND SQUELCH

[75] Inventors: Andrew M. Walker, Gaithersburg; Ova Gene Gabbard, Germantown, both of Md.

[73] Assignee: Digital Communications Corporation, Gaithersburg, Md.

[21] Appl. No.: 624,092

[22] Filed: Oct. 20, 1975

[51] Int. Cl.² .............................................. H04B 1/16
[52] U.S. Cl. .................................... 325/419; 325/478; 331/17
[58] Field of Search .................. 325/346, 348, 349, 63, 325/418–423, 478; 343/7 A; 329/122; 331/1 A, 4, 25, 17, 14

[56] References Cited

U.S. PATENT DOCUMENTS

| | | | |
|---|---|---|---|
| 3,470,475 | 9/1969 | Peterson et al. | 325/421 |
| 3,525,945 | 8/1970 | Puente | 325/419 |
| 3,541,449 | 11/1970 | Broderick et al. | 325/422 |
| 3,878,527 | 4/1975 | Rensin et al. | 325/421 |
| 3,885,238 | 5/1975 | Klein et al. | 343/7 A |
| 3,903,482 | 9/1975 | Pausini et al. | 331/17 |

*Primary Examiner*—Robert L. Griffin
*Assistant Examiner*—Jin F. Ng
*Attorney, Agent, or Firm*—Pollock, Vande Sande & Priddy

[57] ABSTRACT

A phase locked loop with pre-set and squelch capability particularly adapted for burst type signals. In addition to the conventional phase detector, loop filter (LF) and voltage controlled oscillator (VCO) the loop includes a squelch switch connected between the phase detector and LF. A track and hold circuit is connected in series with another switch between output and input of the LF. Both switches and the track and hold circuit itself are controlled by the output of a level detector which indicates presence of an intermittent (i.e., bursty) carrier. The squelch switch is closed, connecting the phase detector to the LF, when the output of the level detector indicates the presence of a carrier burst. At the same time, the second switch is opened so that the LF is not affected by the output of the track and hold circuit. In addition, the track and hold circuit is enabled to track the error voltage output of the LF. At the conclusion of a burst the squelch switch is opened so that the noisy output of the phase detector will not affect the LF. In addition, the second switch is closed to allow the output of the track and hold circuit to reach the LF and finally, the track and hold circuit holds the previous error voltage output of the LF. Thus the error voltage, at the conclusion of the carrier burst, is provided by the track and hold circuit to the LF to maintain the VCO at the last known carrier frequency.

9 Claims, 2 Drawing Figures

PHASE LOCKED LOOP WITH PRE-SET AND SQUELCH

FIELD OF THE INVENTION

The present invention relates to improved phase locked loops especially adapted for use in burst type communication systems for rapidly acquiring the carrier frequency.

BACKGROUND OF THE INVENTION

The present invention relates to phase locked loops which themselves have been employed in communication systems for many years. Phase locked loops have been employed in communication systems to generate, or regenerate, a "clean" replica of the carrier signal for demodulation purposes. Such loops are quite effective in tracking in that they follow small changes in the carrier signal with good fidelity.

In designing any phase locked loop a number of alternatives and tradeoffs are available depending on the particular application. For instance, increasing the bandwidth of the loop allows a wider capture range in that the loop is capable of locking up to signals whose frequency offset, from the natural frequency of the loop oscillator, is greater. The price which is paid for increasing the bandwidth of the loop is additional noise in the loop output.

In some communication systems a premium is placed upon rapid acquisition and loop lock. Typical characteristics of these systems include burst type communications such as voice operated communication links, TDMA (time division multiple access) and the like. In these systems the carrier signal is present only when information is being transmitted and to maximize the effectiveness of the system quick loop lock is desired for effective demodulation. One technique, known to the art, for decreasing acquisition time is to pre-set, by some manner or other, the loop oscillator to the expected carrier frequency. For instance, in a voice operated communication link the carrier is not present during the pauses which naturally occur in the speech process. However, it can be safely assumed that the transmitter carrier frequency will not change greatly during the period of the pause. Therefore, if the loop oscillator can be maintained at the frequency at which it was operating at the initiation of the pause it can be expected to be close to the actual carrier frequency at the termination of the pause.

The prior Klein et al. U.S. Pat. No. 3,885,238 is an example of a phase locked loop with pre-set capability although in a slightly different environment. Klein et al. provides a memory device 10 which monitors the error voltage output of the loop filter during the tracking phase of operations. The memory device is enabled to provide an error signal to the loop oscillator when the loop is not tracking to the end that the loop oscillator may be preset to the expected carrier frequency when the loop begins tracking. However, the Klein et al. arrangement has a number of drawbacks which the present invention seeks to overcome.

For example, when the Klein et al. loop is not tracking, the low pass filter 6 may still continue to produce an output voltage which, since the carrier is not present, will be generated by noise. Since this signal is coupled to the memory device 10 it may well contaminate the previously stored error voltage to the end that when the carrier again is present the loop oscillator may not be pre-set to the desired frequency. Furthermore, the loop filter exhibits capacitive impedance which implies that a time constant is associated with the filter. Since the memory device 10 provides the error voltage, when the loop is not tracking, to the loop oscillator, the loop filter is maintained at an essentially random voltage since its only input consist of a signal which is generated by noise. When the carrier signal again reappears the loop filter must either be charged or discharged to the correct error voltage prior to loop lock.

It is therefore one object of the present invention to provide an improved phase locked loop with pre-set and squelch features. More particularly, it is another object of the present invention to provide an improved phase locked loop which includes a track and hold circuit for storing therein a signal which is representative of a loop error voltage during the presence of the carrier. It is another object of the present invention to provide an improved phase locked loop where the track and hold circuit maintains a quantity representative of loop error voltage during the period when the carrier is absent and provides such signals to the input of the loop filter. It is a further object of the present invention to provide an improved phase locked loop which has squelch capabilities for disconnecting the input of the loop filter from the output of the phase detector to prevent noise from interferring in maintaining the loop oscillator pre-set at the desired frequency.

SUMMARY OF THE INVENTION

These and other objects of the invention are met by providing an improved phase locked loop with pre-setting and squelch capabilities. In addition to the conventional loop components, i.e., a phase detector, loop filter and loop oscillator, the improved loop of the invention includes a track and hold circuit whose input is connected to the output of the loop filter and whose output is connected, through a switching device to the input of the loop filter. During normal tracking operation the switching device is opened and the track and hold circuit is responsive to the loop error voltage produced by the loop filter. Means are provided for sensing the absence of the carrier and for closing the switching device to provide the signal maintained by the track and hold circuit to the input of the loop filter for maintaining the loop oscillator at the frequency generated during tracking and for maintaining the loop filter charged appropriately. A second switching device is included between the output of the phase detector and the input of the loop filter which switching device is controlled by the aforementioned means. During normal tracking operation the second switching device is maintained in a closed condition and, when the carrier disappears the switching device is opened to prevent noise from interferring in the proper operation of the pre-setting action of the track and hold circuit. When the carrier is detected the first switching device is opened, to prevent the track and hold circuit from interferring in normal loop acquisition and tracking operations and the second switching device is closed to enable normal loop operation.

BRIEF DESCRIPTION OF THE DRAWINGS

The present invention will be disclosed in this specification taken in conjunction with the attached drawings in which like reference characters identify identical apparatus and in which.

DETAILED DESCRIPTION OF THE DRAWINGS

Figure 1:
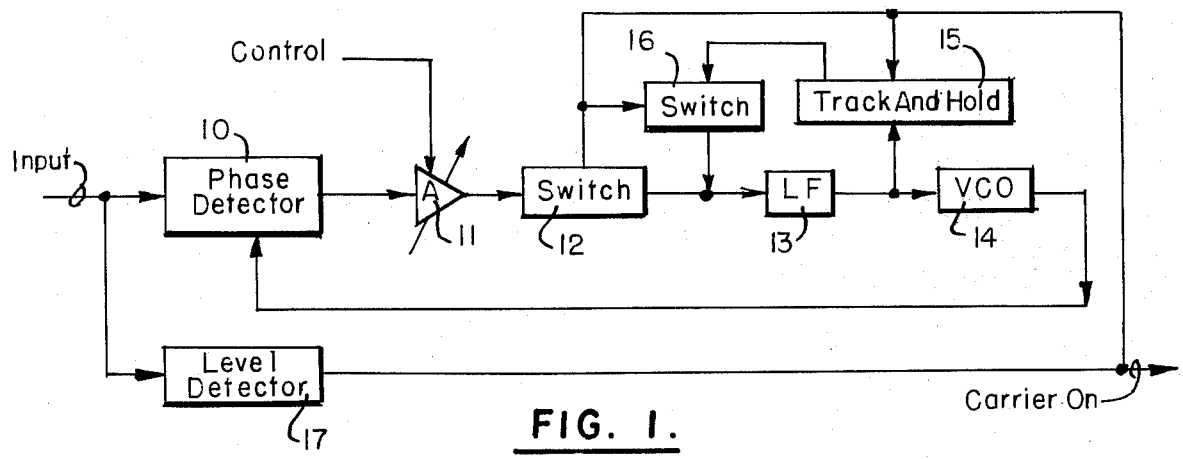
FIG. 1 is a block diagram of the improved phase locked loop of this invention.

FIG. 1 illustrates a preferred embodiment of the invention. In particular, FIG. 1 illustrates a conventional phase detector 10, serially connected to an amplifier 11. The output of the amplifier 11 is connected through switch 12 to the input of loop filter (LF) 13. The output of loop filter 13 is provided both to VCO 14 and track and hold circuit 15. The VCO output provides an input to the phase detector. The output of the track and hold circuit is provided to switch 16, the output of which is also provided to the input of loop filter 13. A level detector 17 is connected to receive the same carrier input as that provided to the phase detector 10. The output of the level detector 17 controls the condition of the track and hold circuit 15 as well as the condition of switches 12 and 16.

Figure 2:
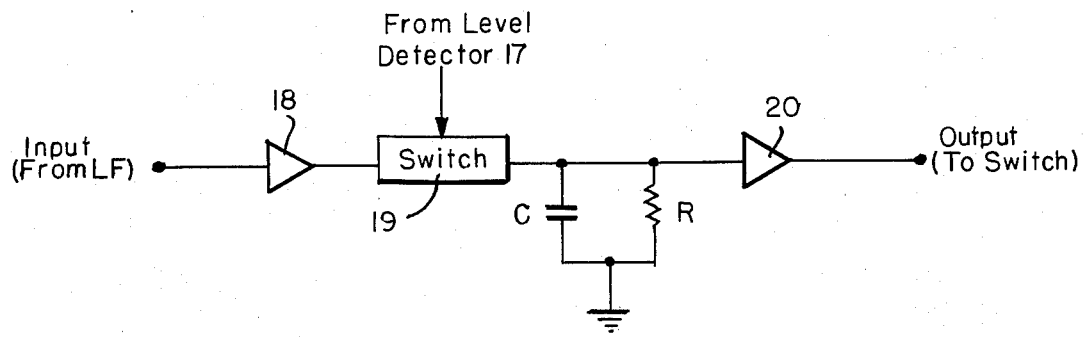
FIG. 2 is a block diagram of a typical track and hold circuit component of the inventive circuit.

The construction of phase detector 10, loop filter 13 and VCO 14 may be conventional. As such a detailed description thereof is not believed necessary. Switches 12 and 16 can be implemented with a wide variety of devices so long as they exhibit good switching action, that is so long as they exhibit a high impedance when opened and a low impedance when closed. In practice FET switches are generally preferable although a wide variety of electronic and electro-mechanical switches may be used so long as the response time of the switch is considered adequate depending upon the response time for the particular application. Level detector 17 can comprise any of a wide variety of known circuits which are capable of detecting the presence of a signal at its input above a predetermined threshold by a distinctive change in its output voltage and/or current. A simple voltage comparator may be adequate which is supplied with a reference voltage of appropriate magnitude. Track and hold circuit 15 performs a memory function and thus can be implemented with a wide variety of devices which has a relatively short response time and a relatively long decay time. Acceptable response and decay times will be dictated, of course, by the particular application. One preferred embodiment of a track and hold circuit 15 is illustrated in FIG. 2 and will be discussed in more detail hereinafter. Amplifier 11 can be any conventional amplifier whose gain can be changed in response to a control signal.

In normal tracking operation, that is in the presence of a carrier, the output of level detector 17 will control switch 12 to be closed and switch 16 to be opened. In this condition the loop operates in the conventional fashion and the presence of amplifier 11 allows the loop bandwidth to be varied by changing the gain of the amplifier. Thus, typically after acquisition has been detected the loop bandwidth may be decreased by controlling the gain of amplifier 11, in a manner conventional in the art. Since switch 16 is opened the output of track and hold circuit 15 has no effect on the LF 13 or any other component in the loop. However, track and hold circuit 15 is responsive (during loop tracking) to the error voltage output of LF 13 and, within its relatively short response time tracks the variation in this error voltage.

At the conclusion of the carrier burst the output of level detector 17 opens switch 12 and closes switch 16. In addition, at this time track and hold circuit 15 is disabled from responding to the error voltage output of LF 13. Under these conditions the output of track and hold circuit 15 is made available to the input of LF 13 through the closed switch 16. Thus, VCO 14 is stabilized at the last known frequency of the carrier. Since track and hold circuit 15 now does not respond to the error voltage the track and hold circuit 15 acts, in effect, as a source of error voltage for the VCO 14. This condition will be stabilized, within the relatively long discharge time of track and hold circuit 15. Assuming that the discharge time for track and hold circuit 15 is much longer than the expected delay between carrier bursts, when the next carrier burst is received the VCO 14 will be oscillating at a frequency equal to the carrier frequency at the termination of the previous burst. In this condition, the VCO 14 is thus pre-set for reception of the next burst and rapid acquisition of a proper frequency. When level detector 17 again detects the presence of the carrier it opens switch 16, closes switch 12 and the loop is then enabled to track the carrier frequency in the manner previously referred to.

FIG. 2 is an example of a preferred embodiment of a suitable track and hold circuit 15. FIG. 2 illustrates that the embodiment of the track and hold circuit 15 includes a buffer amplifier 18 whose input is connected to the output of LF 13. The output of buffer amplifier 18 is connected as the input to a switch 19 whose output is connected to the parallel connection of a terminal of a capacitor C and a resistor R. The other terminals of the capacitor C and resistor R are connected together and may be connected to circuit ground. The output of switch 19 is connected as the input to an FET amplifier 20 whose output is connected to the input of switch 16. The condition of switch 19 is controlled by the output of level detector 17 such that the switch is closed when level detector 17 detects the presence of a carrier and, correspondingly switch 19 is opened when level detector 17 detects the absence of the carrier.

In operation, when the apparatus of FIG. 1 is in the tracking mode, that is when the carrier is present, the loop error voltage, provided by the output of LF 13 charges capacitor C through the closed switch 19. At the conclusion of a burst, when the carrier disappears, switch 19 is opened through the action of level detector 17. In this condition then the capacitor C is effectively disconnected from the loop error voltage by the opened switch 19. However, the voltage stored on capacitor C is made available, through amplifier 20 and closed switch 16 to the input of LF 13. In order for the track and hold circuit 15 to track quickly, the charging time of the capacitor should be made relatively short, and, at the same time, the discharge time for capacitor C should be made relatively long so that the capacitor C will maintain the charge during the periods of time when the carrier is not available. In one embodiment of the invention in which switch 19 was implemented with an FET switch with a relatively low impedance, when closed, a 0.01 micro farad capacitor was employed for capacitor C for a charging time constant of approximately 200 nanoseconds. On the other hand, resistor R at a value of 3 kiloMeg ohms gives a discharge time constant of 30 seconds.

A number of significant advantages flow from employing the inventive circuit configuration illustrated in FIG. 1. The use of pre-set phase locked loops is based on the benefit obtained from pre-setting the VCO to a frequency related to the last known frequency of the signal which is to be received. This is based on the assumption that whatever the long term drifts of the carrier frequency might be, short time drifts, that is drifts between different bursts, is more limited. As a result, when the carrier is again received the VCO is oscillating at a frequency relatively near to the carrier frequency so the acquisition time for the loop will be relatively short. In order to pre-set the VCO an error voltage must be produced which corresponds to the desired frequency. The use of the circuit of FIG. 1 provides this presetting error voltage to the input of LF 13, or more accurately, maintains this error voltage during the period when the carrier is absent. Maintaining this error voltage at the input to LF 13 during the absence of the carrier is desirable since conventionally phase locked loop LF's illustrate capacitive type impedence and thus have associated therewith a charging time. By maintaining the pre-setting error voltage at the input to the LF, the LF remains charged thus eliminating the necessity to re-charge the LF when the carrier again reappears.

In addition, the squelch switch 12 prevents noise from affecting the pre-setting voltage on the input to the LF during the absence of the carrier. Although normally noise voltages are of much lower magnitude than signal voltages, in phase locked loops, especially in burst communication applications, noise voltages can rise to levels equal to or even greater than the error voltage necessary to drive the VCO to the desired frequency. In particular, we have found that while an error voltage of one volt might be necessary at the VCO, noise voltages of up to 5 volts have been measured at the input to the VCO during the absence of the carrier.

Although we have illustrated herein a preferred embodiment of a track and hold circuit 15 those of ordinary skill in the art will understand that a wide variety of equivalent circuits may be employed so long as the circuit exhibits the necessary short charging and relatively long discharging time.

We claim:

1. An improved phase locked loop with pre-set capabilities including an input connected to a phase detector, and, serially connected thereafter, a loop filter and a loop oscillator, the improvement comprising,
    means for detecting the presence and absence of a carrier signal connected to said input,
    track and hold means having an input connected to said loop filter output and an output connected to an input of said loop filter and responsive to said means for detecting, for sensing and storing loop filter output in the presence of said carrier and for supplying a signal representative of said stored loop filter output to said loop filter input in the absence of said carrier to maintain the charge of the loop filter in substantially the same condition as when the carrier is present,
    whereby said loop oscillator is pre-set in the absence of said carrier.

2. The apparatus of claim 1 which includes a switching device connected between said phase detector output and said loop filter input controlled by said means for detecting, said switching device being controlled by said means for detecting to be opened in the absence of said carrier and closed in the presence of said carrier,
    whereby noise produced by said phase detector in the absence of said carrier is prevented from reaching said loop filter.

3. The apparatus of claim 1 wherein said track and hold means includes switching means controlled by said means for detecting, for connecting said track and hold means output to said loop filter input only in the absence of said carrier and, for at other times, disconnecting said track and hold means output from said loop filter input.

4. The apparatus of claim 3 which further includes a variable gain amplifier included in said loop for decreasing said loop gain and said loop bandwidth in response to a control signal.

5. The apparatus of claim 3 which further includes a second switching device connecting the output of said phase detector to the input of said loop filter, said second switching device being controlled by said means for detecting to open said second switching device in the absence of said carrier and to close said second switching device in the presence of said carrier,
    whereby noise produced by said phase detector in the absence of said carrier is prevented from reaching said loop filter input.

6. The apparatus of claim 5 wherein said track and hold means further includes a serial combination of a third switching device and parallel connected R-C means, said third switching device controlled by said means for detecting for, at times, connecting said loop filter output to said parallel R-C means, in the presence of said carrier and, for disconnecting said loop filter output from said parallel R-C means in the absence of said carrier.

7. The apparatus of claim 6 in which said parallel R-C means comprises a parallel combination of capacitive and resistive means.

8. The apparatus of claim 7 wherein said capacitive means has a relatively short time constant when said third switching device is closed and a relatively long time constant when said third switching device is opened.

9. A method of pre-setting a phase locked loop employed in a burst type communication system which phase locked loop includes a phase detector, loop filter and loop oscillator, comprising the steps of:
    sensing the presence of a carrier and storing a signal representing loop error voltage in the presence of said carrier,
    detecting absence of said carrier and responsive thereto maintaining said stored loop error voltage and providing a signal representative thereof to said loop filter to maintain said loop oscillator at the frequency generated during the presence of said carrier, and
    disconnecting said loop filter from said phase detector in the absence of said carrier.

* * * * *